United States Patent
Kim et al.

(10) Patent No.: US 7,130,232 B2
(45) Date of Patent: Oct. 31, 2006

(54) INTEGRATED CIRCUIT DEVICES HAVING MULTIPLE PRECHARGE CIRCUITS AND METHODS OF OPERATING THE SAME

(75) Inventors: Joung-Yeal Kim, Gyeonggi-do (KR); Young-Uk Chang, Gyeonggi-do (KR); Kyoung-Ho Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 540 days.

(21) Appl. No.: 10/744,179

(22) Filed: Dec. 23, 2003

(65) Prior Publication Data
US 2004/0165416 A1  Aug. 26, 2004

(30) Foreign Application Priority Data
Feb. 26, 2003  (KR)  .................. 10-2003-0012068

(51) Int. Cl.
*G11C 7/12* (2006.01)
(52) U.S. Cl. ...................... 365/203; 365/190
(58) Field of Classification Search ............... 365/203, 365/185.25, 190
See application file for complete search history.

(56) References Cited

U.S. PATENT DOCUMENTS

| | | | | |
|---|---|---|---|---|
| 5,973,972 A | * | 10/1999 | Kwon et al. | 365/203 |
| 6,154,397 A | * | 11/2000 | Chu et al. | 365/198 |
| 6,275,429 B1 | * | 8/2001 | Bae et al. | 365/203 |
| 6,337,822 B1 | * | 1/2002 | Kwak et al. | 365/203 |

* cited by examiner

*Primary Examiner*—Tan T. Nguyen
(74) *Attorney, Agent, or Firm*—Myers Bigel Sibley & Sajovec

(57) ABSTRACT

Integrated circuit devices are provided including a pair of differential I/O lines and a driver circuit. The driver circuit is configured to drive the pair of differential I/O lines responsive to a write command signal. First and second precharge circuits are also provided. The first precharge circuit is configured to precharge the pair of differential I/O lines to a first voltage during a first mode of operation responsive to an active command signal. The second precharge circuit is configured to precharge the pair of differential I/O lines to a second voltage, lower than the first voltage, during a second mode of operation responsive to the active command signal. Related methods of operating integrated circuit devices are also provided.

34 Claims, 15 Drawing Sheets

INTEGRATED CIRCUIT DEVICES HAVING MULTIPLE PRECHARGE CIRCUITS AND METHODS OF OPERATING THE SAME

RELATED APPLICATION

This application is related to and claims priority from Korean Patent Application No. 2003-12068 filed on Feb. 6, 2003, the disclosure of which is hereby incorporated herein by reference as if set forth in its entirety.

FIELD OF THE INVENTION

The present invention relates to integrated circuit devices and methods of operating the same and, more particularly, to integrated circuit memory devices and methods of operating the same.

BACKGROUND OF THE INVENTION

Integrated circuit memory devices may be used in electronic devices to store data. Furthermore, integrated circuit memory devices that consume a relatively small amount of power may be used in electronic devices that use power supplied from, for example, a battery. Manufacturers of integrated circuit devices have tried to reduce the overall power consumption of integrated circuit memory devices by, for example, changing a structure of a driver used to drive input/output (I/O) lines of the integrated circuit device during a write operation. A driver may be, for example, a pull-up transistor. Conventionally, positive-channel metal oxide semiconductor (PMOS) transistors have been used as the pull-up transistors. However, recently, the PMOS transistors have been replaced with negative channel metal oxide semiconductor (NMOS) transistors as NMOS transistors may consume less power.

In particular, when PMOS transistors are used as the pull-up transistor in a driver of an integrated circuit device, an I/O line may swing from a ground voltage (GND) to a power supply voltage (VCC) or vice versa. On the other hand, when an NMOS transistor is used as the pull-up transistor in a driver of an integrated circuit memory device, an I/O line may only swing from the ground voltage to a power supply voltage (VCC) decreased by a threshold voltage of the NMOS transistor ($V_{th}$) or vice versa. Accordingly, it may be possible to reduce current consumed when the I/O line is driven.

Referring now to FIG. 1, an I/O line driver circuit using an NMOS transistor as a pull-up transistor will be discussed. As illustrated in FIG. 1, an I/O line driver circuit 10 includes first and second drivers DRV1 and DRV2 that drive a pair of differential I/O lines IO<0> and IOB<0>, respectively. The first and second drivers DRV1 and DRV2 are pull-up transistors. The first driver DRV1 includes first and second NMOS transistors M1 and M2. Similarly, the second driver DRV2 includes third and fourth NMOS transistors M3 and M4. A precharge circuit 20 is coupled to the pair of differential I/O lines IO<0> and IOB<0> and includes first, second, and third PMOS transistors M5, M6, and M7. When the precharge circuit 20 is activated, the pair of differential I/O lines IO<0> and IOB<0> are precharged to a power supply voltage VCC.

It will be understood that although only a single I/O line driver circuit corresponding to a single pair of differential I/O lines and a single precharge circuit is shown in FIG. 1, I/O lines corresponding to the other pairs of differential I/O lines and other precharge circuits may be included. A plurality of pairs of differential I/O lines may be connected to a memory bank having a plurality of memory blocks. A single memory bank is illustrated in FIG. 1.

Referring now to the schematic block diagram of FIG. 1 and the timing diagrams of FIGS. 2 through 4, an active command signal PWR may be activated to store external data in a memory bank and a write command signal CBA_A may be activated responsive to the activation of the active command PWR. When the write command signal CBA_A is activated, an I/O line precharge signal PIOPRB_A is deactivated (to a logic high) and a write pulse signal PDT_A is activated.

Prior to the activation of the write command signal CBA_A, first, second and third PMOS transistors M5, M6, and M7 of precharge circuit 20 are turned on to precharge the pair of differential I/O lines IO<0> and IOB<0> to a power supply voltage VCC. Because, at this time, the write pulse signal PDT_A is deactivated at a logic low (FIG. 2), first, second, third and fourth NMOS transistors M1 through M4 are all turned off.

When the write command signal CBA_A is activated, first through third PMOS transistors M5 through M7 of the precharge circuit 20 are turned off and the first through fourth NMOS transistors M1 through M4 are selectively turned on according to input data DIO<0>. For example, when the input data DIO<0> is "1", the first and fourth NMOS transistors M1 and M4 are turned off and the second and third NMOS transistors M2 and M3 are turned on. When all the input data DIO<0> is written to a selected memory bank, the write command signal CBA_A may be deactivated and the pair of differential I/O lines IO<0> and IOB<0> may again be precharged to the power supply voltage VCC.

A data masking signal PDMB may be activated (to a logic low) during a write operation. With the activation of the data masking signal PDMB, pairs of differential I/O lines of respective memory banks may be precharged and the first through fourth NMOS transistors M1 through M4 may all be turned off.

Although the use of NMOS transistors as pull-up transistors in place of PMOS transistors has reduced power consumption of integrated circuit memory devices, integrated circuit devices including the NMOS transistors may experience decreased performance in other aspects of the device, which will now be discussed with respect to the timing diagrams of FIGS. 2 through 4. When input data DIO<0> is first loaded on the pair of differential I/O lines, there is typically a skew, i.e., difference in arrival time of the input data, between ones of the pair of differential I/O lines. Because the I/O lines are precharged to a power supply voltage VCC, the first driver DRV1 or the second driver DRV2 of an I/O line driver circuit 10 cannot drive an I/O line having a voltage of VCC−$V_{th}$. For example, when input data DIO<0> is "1", second and third NMOS transistors M2 and M3 of the driver circuit 10 are turned on. On the other hand, because gate and source voltages of the third NMOS transistor M3 are all at the power supply voltage VCC, the NMOS transistor M3 is turned off. Thus, a voltage, for example, a precharge voltage VCC, of the I/O line IOB<0> is maintained. When input data DIO<0> is "0", the first and fourth NMOS transistors M1 and M4 of the driver circuit 10 are turned on. This enables the first NMOS transistor M1 to drive the I/O line IOB<0> with VCC−$V_{th}$ and enables the fourth NMOS transistor M4 to discharge a voltage, for example, a precharge voltage VCC, of the I/O line IO<0> to a ground voltage (GND).

As illustrated by dotted lines of FIGS. 2 through 4, when data is loaded on the pair of differential I/O lines, there may be a skew between the I/O lines IO<0> and IOB<0>. This skew typically occurs whenever I/O lines are precharged and data is loaded on the precharged I/O lines. Accordingly, during a seamless write operation where data is successively stored in successive memory banks, I/O lines of a previously selected memory bank are precharged after the write operation is complete for that memory bank. For example, I/O lines of a first bank A may be precharged after a write operation is completed, as shown in FIG. 4. After a write operation for the second bank B a write operation for the first bank A is conducted. At this time, the I/O lines of the second bank B are precharged to VCC. Thus, when the seamless write operation is conducted, I/O lines of an unselected memory bank or previously selected memory bank may be unnecessarily precharged.

SUMMARY OF THE INVENTION

Embodiments of the present invention provide integrated circuit devices including a pair of differential I/O lines and a driver circuit. The driver circuit is configured to drive the pair of differential I/O lines responsive to a write command signal. First and second precharge circuits are also provided. The first precharge circuit is configured to precharge the pair of differential I/O lines to a first voltage during a first mode of operation responsive to an active command signal. The second precharge circuit is configured to precharge the pair of differential I/O lines to a second voltage, lower than the first voltage, during a second mode of operation responsive to the active command signal.

In some embodiments of the present invention, the integrated circuit device may further include a timing control circuit configured to deactivate the first precharge circuit and activate the second precharge circuit responsive to assertion of the active command signal. In certain embodiments of the present invention, the timing circuit may be further configured to deactivate the second precharge circuit responsive to assertion of the write command signal.

In further embodiments of the present invention, the timing control circuit may be further configured to activate the first precharge circuit responsive to the deactivation of the active command signal. In certain embodiments of the present invention, the first voltage may be a power supply voltage and the second voltage may be a ground voltage. The second precharge circuit may include first and second NMOS transistors. The first NMOS transistor may be coupled between a first of the pair of differential I/O lines and the ground voltage. The second NMOS transistor may be coupled between a second of the pair of differential I/O lines and the ground voltage.

In still further embodiments of the present invention, the second voltage may be equal to a power supply voltage (VCC) decreased by a threshold voltage of a PMOS transistor (Vth). In certain embodiments of the present invention, the integrated circuit device may include an integrated circuit memory device.

While the present invention is described above primarily with reference integrated circuit devices, methods of operating integrated circuit devices are also provided herein.

DETAILED DESCRIPTION

Figure 1:
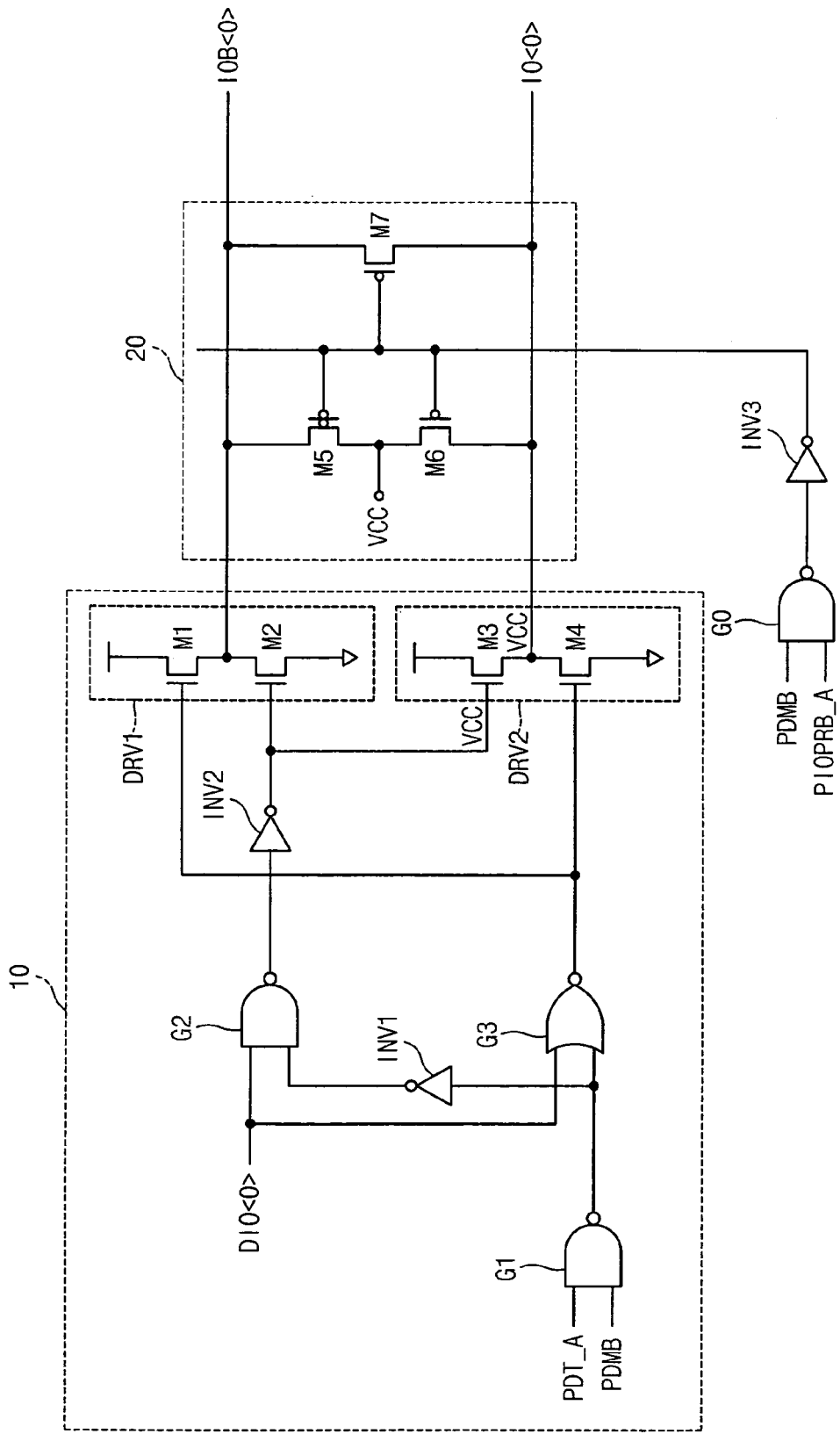
FIG. 1 is schematic diagram illustrating a conventional input/output (I/O) line driver circuit using NMOS transistors as pull-up transistors.
Figure 2:
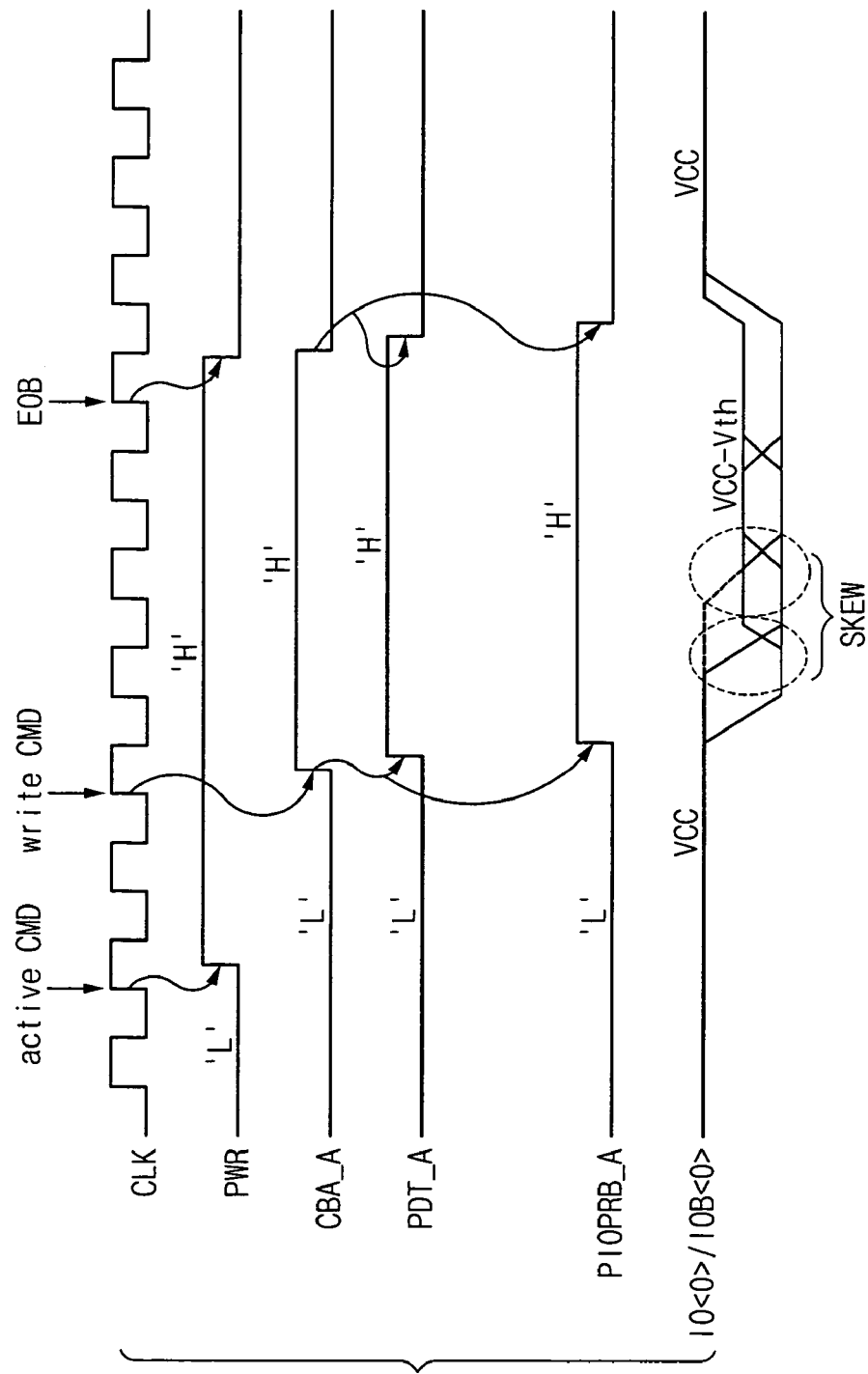
FIGS. 2 through 4 are timing diagrams illustrating operations of conventional integrated circuit memory devices including the I/O driver circuit and precharge circuit illustrated in FIG. 1.
Figure 3:
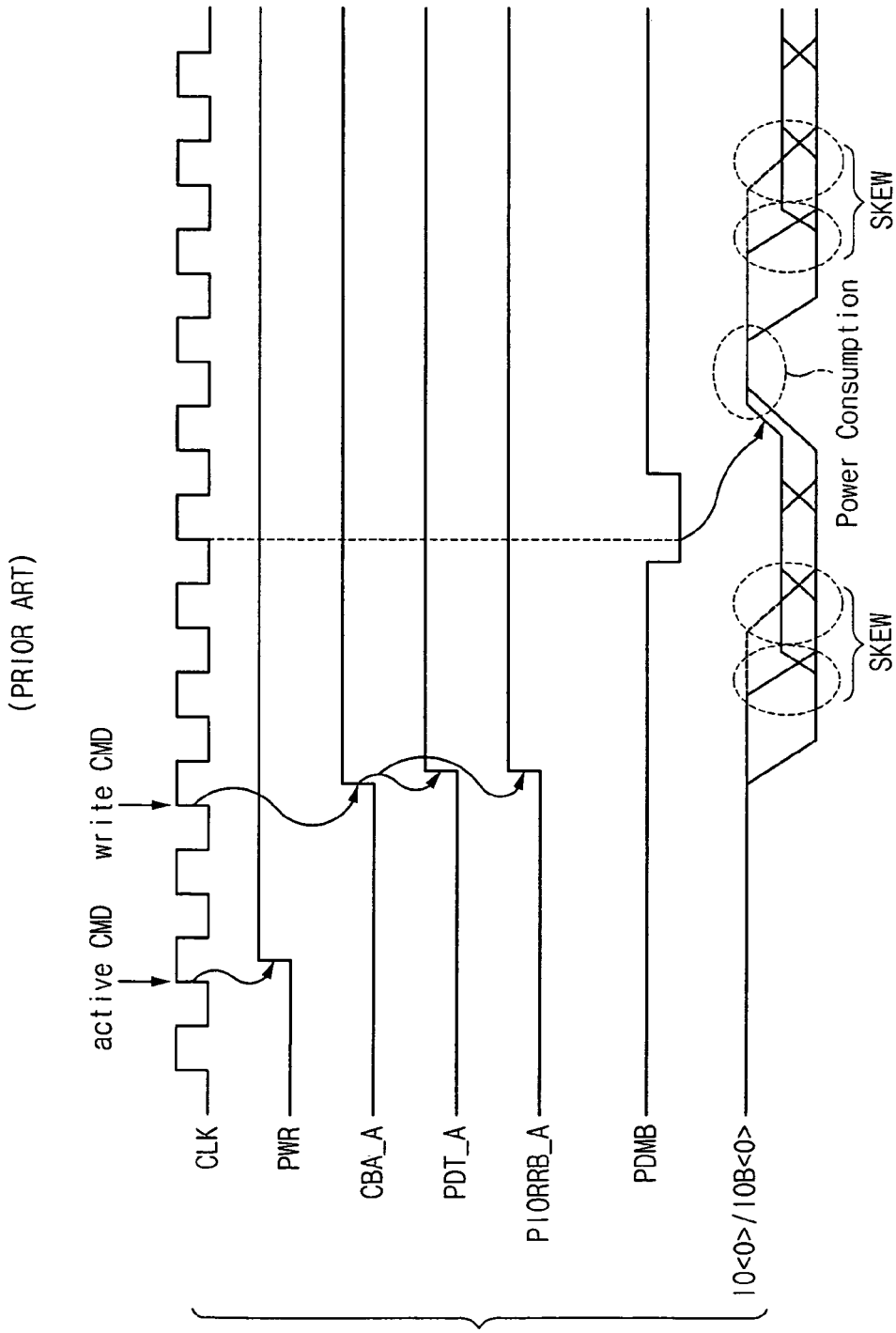
Figure 4:
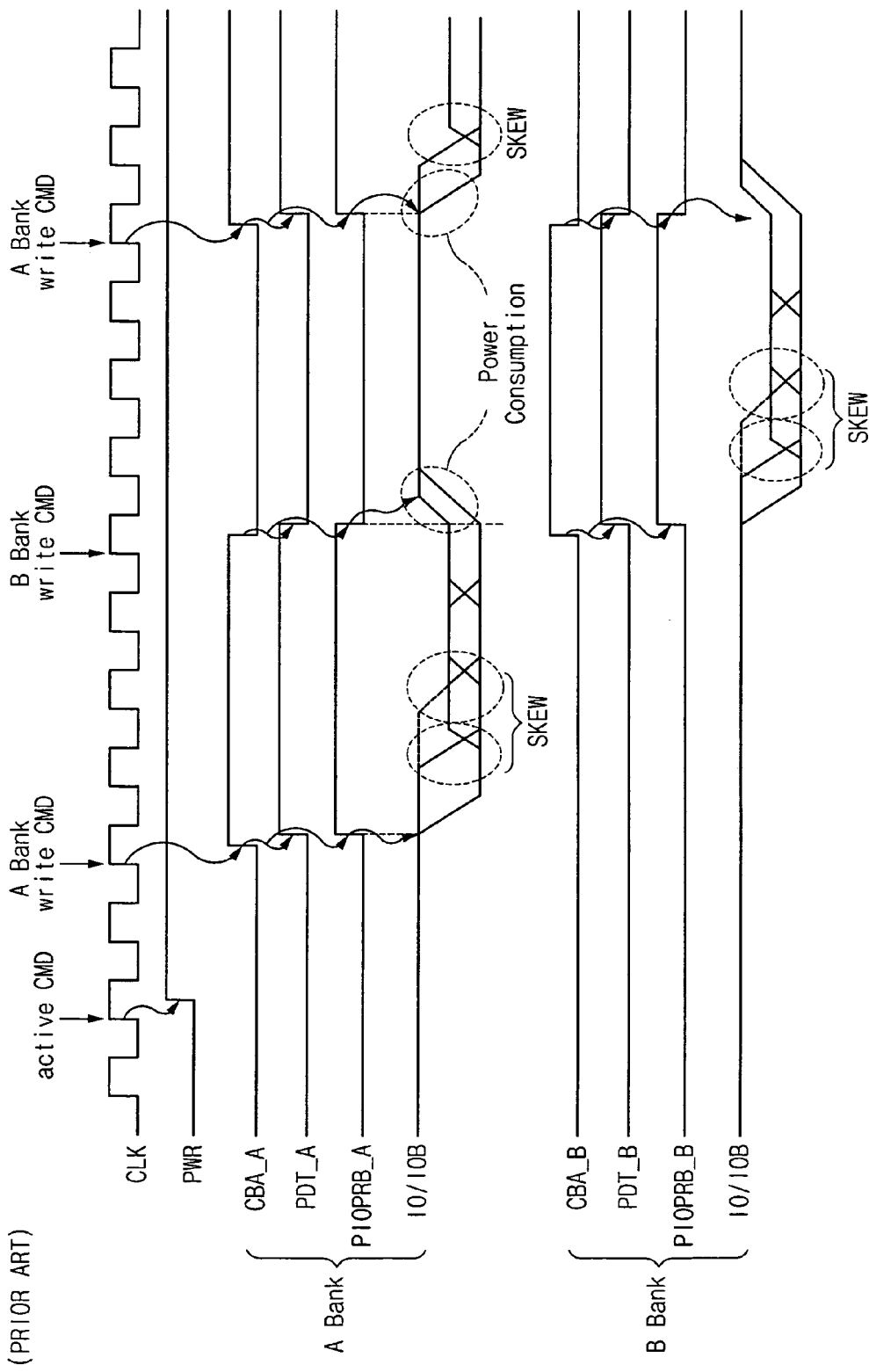

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element is referred to as being "coupled" or "connected" to another element, it can be directly coupled to or connected to the other element or intervening elements may also be present. It will be further understood that when an element is referred to as being "directly coupled" or "directly connected" to another element, no intervening elements may be present. Like numbers refer to like elements throughout.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of the present invention.

Embodiments of the present invention will be described below with respect to FIGS. 5 through 16. Embodiments of the present invention provide integrated circuit devices including pairs of differential I/O lines and a driver circuit configured to drive the pair of differential I/O lines responsive to a write control signal. First and second precharge circuits are also provided. The first precharge circuit is configured to precharge the pair of differential I/O lines to a first voltage during a first mode of operation responsive to an active command signal and the second precharge circuit is configured to precharge the pair of differential I/O lines to a second voltage, lower than the first voltage, during a second mode of operation responsive to the active command signal. Some embodiments of the present invention further include a third precharge circuit configured to precharge the pair of differential I/O lines to a third voltage, lower than the first voltage, responsive to a data masking signal. The ability to precharge the pair or pairs of differential I/O lines to different voltages as discussed herein may provide a reduced skew between the pair or pairs of differential I/O lines. Accordingly, the overall power consumption of integrated circuit devices according to embodiments of the present invention may be reduced.

Figure 5:
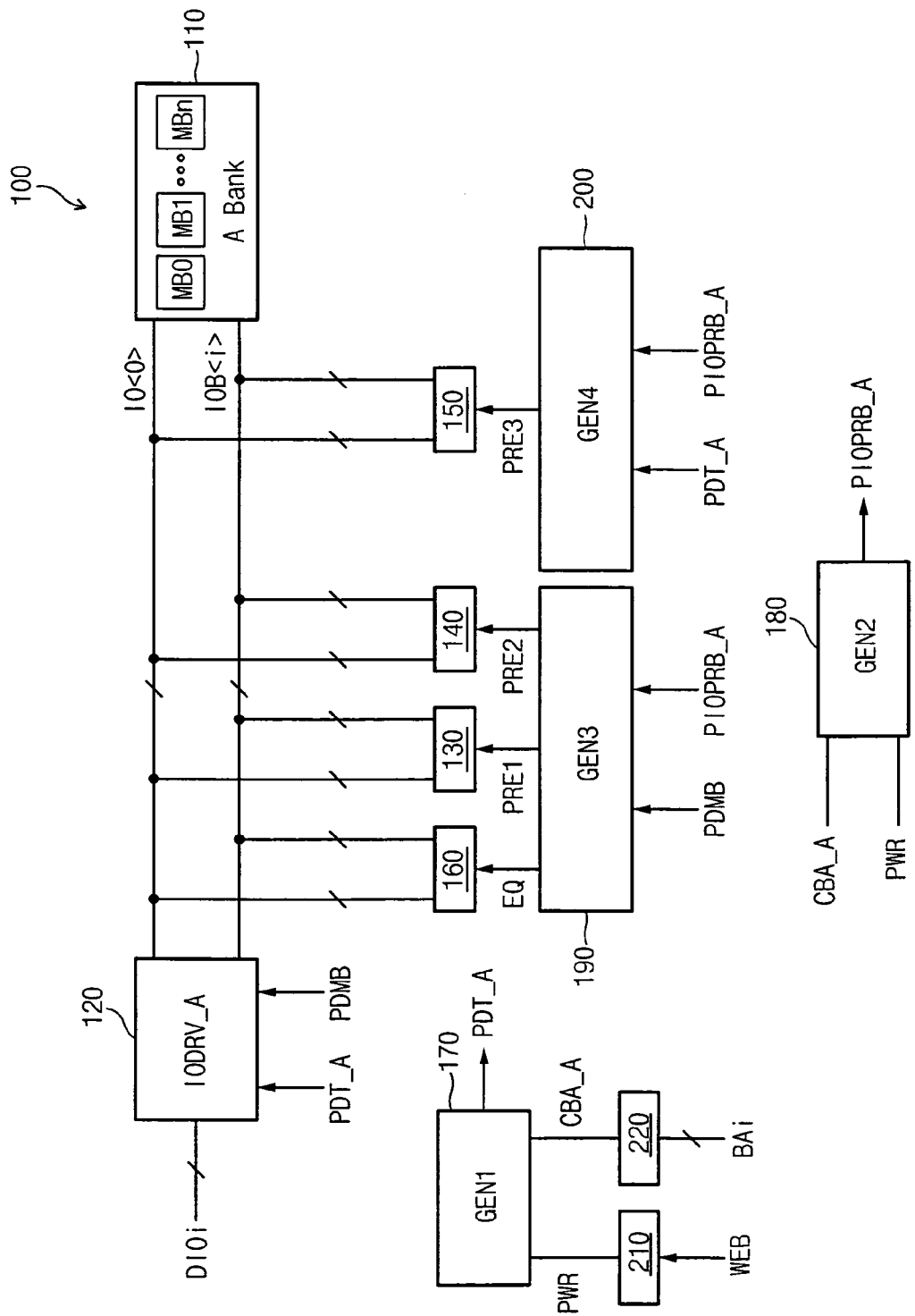
FIG. 5 is a block diagram of integrated circuit memory devices according to some embodiments of the present invention.

Referring now to FIG. 5, integrated circuit memory devices according to some embodiments of the present invention will be discussed. It will be understood that although embodiments of the present invention may be discussed herein with respect to a dual data rate (DDR) synchronous dynamic random access memory (SDRAM), embodiments of the present invention are not limited to this configuration. As illustrated in FIG. 5, an integrated circuit memory device 100 includes a first memory bank 110 having a plurality of memory blocks MB0–MBn. The memory bank 110, an I/O line driver circuit IODRV_A 120, first, second and third precharge circuits 130, 140, and 150, and an equalizer circuit 160 are connected to a pair of differential I/O lines IO<i> and IOB<i>. The I/O line driver circuit 120 may include driver circuits corresponding to the I/O lines. The driver circuits may include, for example, NMOS transistors as discussed above with respect to FIG. 1.

A write pulse generation circuit GEN1 170 generates a write pulse signal PDT_A in response to an active command signal PWR from a signal generation circuit 210 and a write command signal CBA_A from a signal generation circuit 220. The write pulse signal PDT_A is activated when the active command signal PWR and the write command signal CBA_A are activated, and is deactivated when at least one of the active command signal PWR and write command signal CBA_A is deactivated. In some embodiments of the present invention, the write pulse generation circuit GEN1 170 may provide a logical AND function using, for example, an AND gate. It will be understood that write signal generation circuits according to embodiments of the present invention are not limited to including an AND gate, for example, a combination of a NAND gate and an inverter may be used to provide the same functionality without departing from the scope of the present invention.

The active command signal generation circuit 210 generates an active command signal PWR responsive to a write enable signal WEB. The write command signal generation circuit 220 generates a write command signal CBA_A in response to a bank address BAi. The I/O line driver circuit 120 drives pairs of differential I/O lines IO<i> and IOB<i> according to write data DIO<i> when the write pulse signal PDT_A is activated. Furthermore, the I/O line driver circuit 120 is deactivated when a data masking signal PDMB is activated. For example, the data masking signal PDMB may be activated when the write data DIO<i> is loaded on the pair of differential I/O lines IO<i> and IOB<i>. In these embodiments of the present invention, the I/O line driver circuit 120 may be deactivated when the data masking signal PDMB is activated, which will be discussed further below.

Still referring to FIG. 5, a master precharge signal generation circuit GEN2 180 generates a master precharge signal PIOPRB_A responsive to the active command signal PWR and the write command signal CBA_A. The master precharge signal PIOPRB_A is activated when an active command signal PWR is activated, and is deactivated when the active command signal PWR is deactivated. A first signal generation circuit GEN3 190 generates an equalization signal EQ and first and second I/O line precharge signals PRE1 and PRE2 responsive to the data masking signal PDMB and the master precharge signal PIOPRB_A. The first signal generation circuit GEN3 190 activates the equalization signal EQ and the first I/O line precharge signal PRE1 when the master precharge signal PIOPRB_A is activated. The first signal generation circuit GEN3 190 deactivates the equalization signal EQ and the first I/O line precharge signal PRE1 when the master precharge signal PIOPRB_A is deactivated. The first signal generation circuit GEN3 190 activates the equalization signal EQ and the second precharge signal PRE2 when the data masking signal PDMB is activated. The first signal generation circuit GEN3 190 deactivates the equalization signal EQ and the second precharge signal PRE2 when the data masking signal PDMB is deactivated. The equalization signal EQ is activated when the data masking signal PDMB or the master precharge signal PIOPRB_A is activated.

When the first I/O line precharge signal PRE1 is activated, the first precharge circuit 130 precharges the pair of differential I/O lines IO<i> and IOB<i> to a power supply voltage VCC. When the second I/O line precharge signal PRE2 is activated, the second precharge circuit 140 precharges the I/O line precharge pairs IO<i> and IOB<i> to a voltage lower than the power supply voltage VCC. For example, the second precharge circuit 140 may precharge the pair of differential I/O lines IO<i> and IOB<i> to a voltage equal to the power supply voltage (VCC) minus the threshold voltage of an NMOS transistor ($V_{th}$).

The second signal generation circuit GEN4 200 generates a third I/O line precharge signal PRE3 in response to the write pulse signal PDT_A and the master precharge signal PIOPRB_A. The second signal generation circuit GEN4 200 activates the third I/O line precharge signal PRE3 in response to the deactivation of the master precharge signal PIOPRB_A, and deactivates the third I/O line precharge signal PRE3 in response to the activation of the write pulse signal PDT_A.

When the third I/O line precharge signal PRE3 is activated, the third precharge circuit 150 precharges the pair of differential I/O lines IO<i> and IOB<i> to a voltage lower than the power supply voltage VCC. For example, the third precharge circuit 150 may precharge the pair of differential I/O lines IO<i> and IOB<i> to a ground voltage or VCC–$V_{th}$ responsive to the activation of the third I/O line precharge signal PRE3.

According to some embodiments of the present invention, when the active command signal PWR is activated, the master precharge signal PIOPBR_A is deactivated and the third precharge signal PRE3 is activated. When the write command signal CBA_A is activated, the third precharge signal PRE3 is deactivated and write data is transmitted to the write data pair of differential I/O lines IO<i> and IOB<i>. Thus, from activation of the active command signal PWR to activation of the write command signal CBA_A, the pair of differential I/O lines IO<i> and IOB<i> are precharged to a voltage lower than a power supply voltage VCC. Accordingly, when write data is transmitted to the pair of differential I/O lines IO<i> and IOB<i>, a skew between I/O lines of each pair (or I/O line pairs) may be reduced.

When the data masking signal PDMB is activated, the second precharge circuit 140 precharges the pair of differential I/O lines IO<i> and IOB<i> to a voltage lower than the power supply voltage VCC. Thus, when the data masking signal PDMB is deactivated and write data is transmitted to the pair of differential I/O lines, the skew between the I/O lines of each pair (or the pair of differential I/O lines) may be reduced.

The write pulse generation circuit 170, the master precharge signal generation circuit 180, the first signal generating circuit 190, the second signal generating circuit 200, the active command signal generating circuit 210 and the write command signal generating circuit may be generally referred to herein as "timing control circuits". Timing control circuits as used herein are intended to include the functionality of one or more of the signal generation circuits used to generate signals used to turn on and/or off one or more of the first, second and third precharge circuits 130, 140 and 150.

Figure 6:
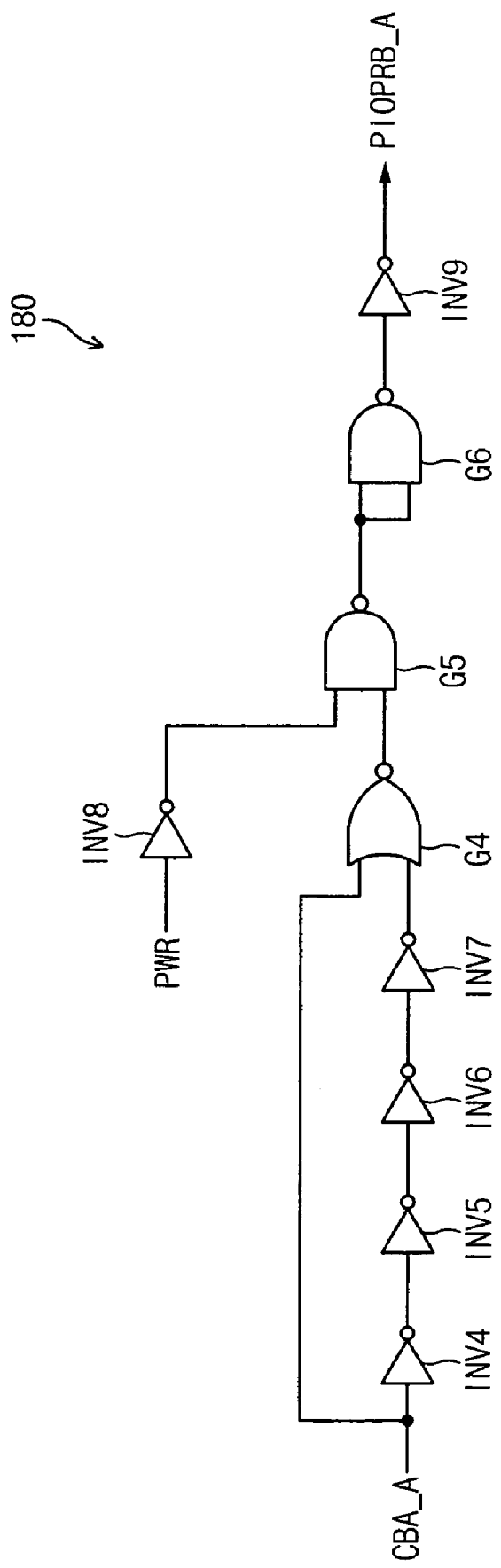
FIG. 6 is a schematic diagram of signal generators used in memory devices according to further embodiments of the present invention.

Referring now to FIG. 6, signal generators 180 illustrated in FIG. 5 according to embodiments of the present invention will now be discussed. As illustrated in FIG. 6, the master precharge generation circuit 180 operates responsive to an active command signal PWR and a write command signal CBA_A and includes first through sixth inverters INV4, INV5, INV6, INV7 INV8, and INV9, a NOR gate G4, and first and second NAND gates G5 and G6. It will be understood that the invertors and logical gates provided in FIG. 6 are provided for exemplary purposes only and that embodiments of the present invention are not limited to this configuration. For example, the function of the first and second NAND gates may be provided by any combination of Boolean operators that provides a NAND functionality without departing from the scope of the present invention. When the active command signal PWR is low, the master precharge generation circuit 180 generates a master precharge signal PIOPBR_A of a low level. The master precharge signal PIOPBR_A is deactivated to a high level when the active command signal PWR is activated high.

Figure 7:
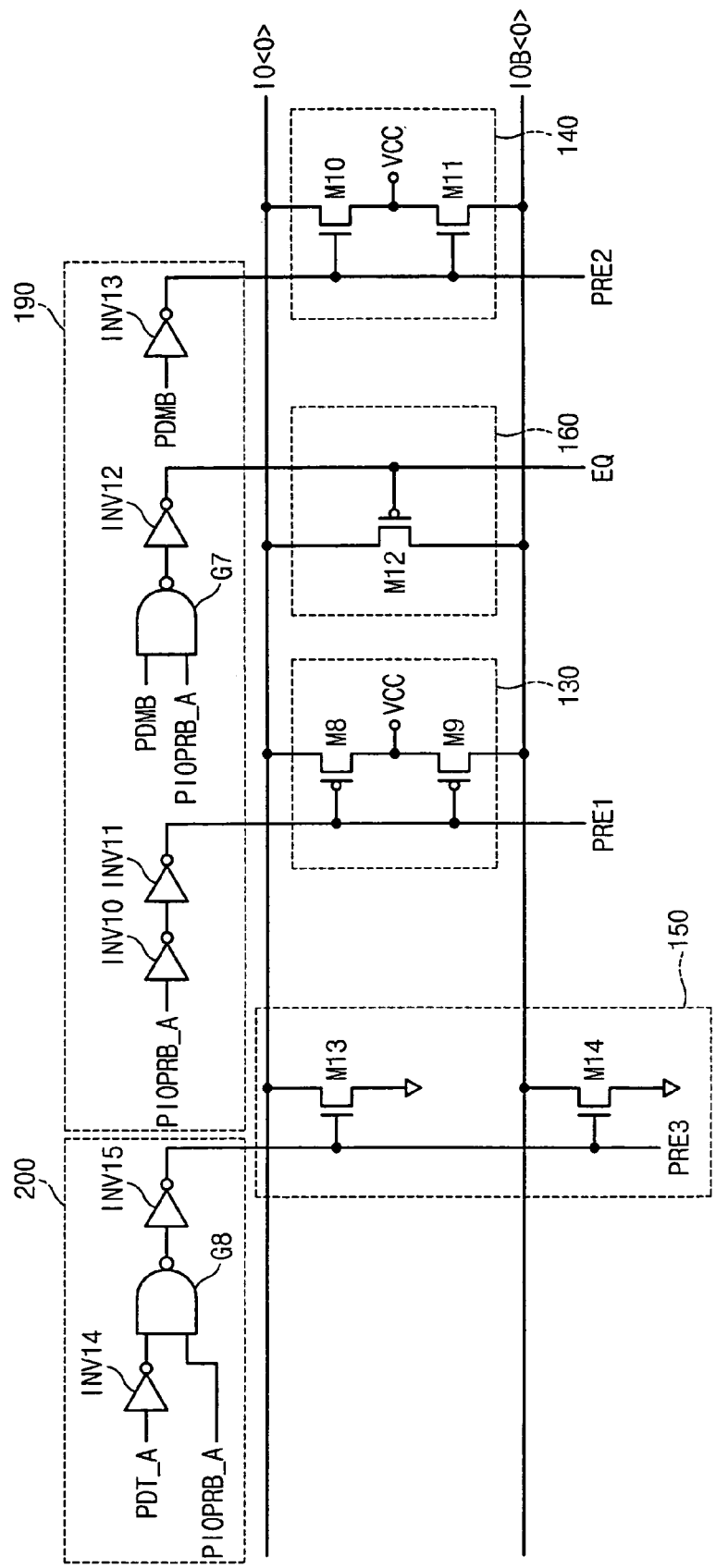
FIG. 7 is a schematic diagram of signal generators, precharge circuits, and equalizer circuits according to some embodiments of the present invention.

Referring now to FIG. 7, signal generators, precharge circuits, and equalizer circuits according to embodiments of the present invention will be discussed. The precharge and equalizer circuits of FIG. 7 correspond to a pair of differential I/O lines IO<0> and IOB<0>. Circuits corresponding to the other pairs of differential I/O lines may have similar structures. Precharge and equalizer circuits coupled to pairs of differential I/O lines of a memory bank may be controlled by signal generators, for example, first and second signal generators 190 and 200.

As illustrated in FIG. 7, the signal generator 190 includes first through fourth inverters INV10, INV11, INV12, and INV13 and a NAND gate G7, connected as shown in FIG. 7. The signal generator 190 generates first and second precharge signals PRE1 and PRE2 and an equalization signal EQ in response to a master precharge signal PIOPRB_A and a data masking signal PDMB. The first precharge signal PRE1 is activated low when the master precharge signal PIOPRB_A is activated low, and is deactivated high when the master precharge signal PIOPRB_A is deactivated high. The second precharge signal PRE2 is activated high when the data masking signal PDMB is activated low, and is deactivated low when the data masking signal PDMB is deactivated high. The equalization signal EQ is activated low when one of the signals PDMB and PIOPRB_A is activated low.

The second signal generation circuit GEN4 200 generates a third precharge signal PRE3 in response to a write pulse signal PDT_A and a master precharge signal PIOPRB_A. The write pulse signal PDT_A is activated high when a write command signal CBA_A is activated high, and is deactivated low when the write command signal CBA_A is deactivated low. The third precharge signal PRE3 is activated high when the master precharge signal PIOPRB_A is deactivated high, and is deactivated low when the write pulse signal PDT_A is activated high.

Still referring to FIG. 7, the first precharge circuit 130 includes first and second PMOS transistors M8 and M9. The first PMOS transistor M8 is coupled between the I/O line IO<0> and a power supply voltage VCC and is controlled by the first precharge signal PRE1. The second PMOS transistor M9 is coupled between the power supply voltage VCC and the I/O line IOB<0> and is controlled by the first precharge signal PRE1. The second precharge circuit 140 includes first and second NMOS transistors M10 and M11. The first NMOS transistor M10 is coupled between the I/O line IO<0> and a power supply voltage VCC and is controlled by the second precharge signal PRE2. The second NMOS transistor M11 is coupled between the power supply voltage VCC and the I/O line IOB<0> and is controlled by the second precharge signal PRE2. The equalizer circuit 160 includes a PMOS transistor M12 that is coupled between the I/O lines IO<0> and IOB<0> and is controlled by the equalization signal EQ. The third precharge circuit 150 includes first and second NMOS transistors M13 and M14. The first NMOS transistor M13 is coupled between the I/O line IO<0> and a ground voltage and is controlled by the third precharge signal PRE3. The second NMOS transistor M14 is coupled between the I/O line IOB<0> and a ground voltage and is controlled by the third precharge signal PRE3.

The first precharge circuit 130 precharges the pair of differential I/O lines IO<0> and IOB<0> to a power supply voltage VCC prior to activation of the active command signal PWR. The second precharge circuit 140 precharges the pair of differential I/O lines IO<0> and IOB<0> to a voltage lower than VCC, for example, VCC-$V_{th}$, when the data masking signal PDMB is activated. The third precharge circuit 150 precharges the pair of differential I/O lines IO<0> and IOB<0> to a ground voltage, from activation of the active command signal PWR to activation of the write command signal CBA_A.

Figure 8:
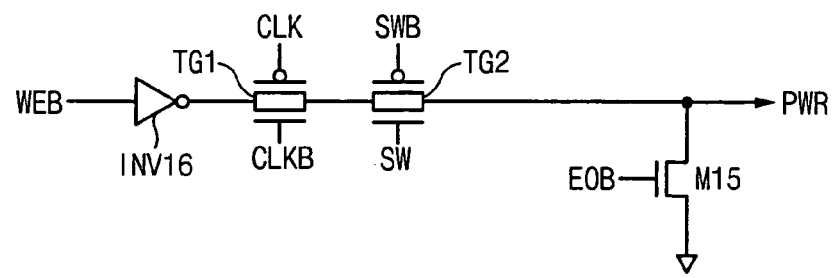
FIG. 8 is a schematic diagram of active command signal generation circuits according to further embodiments of the present invention.

Referring now to FIG. 8, active command signal generation circuits 210 according to embodiments of the present invention will be discussed. As illustrated in FIG. 8, the active command signal generation circuit 210 includes an inverter INV16, first and second transmission gates TG1 and TG2, and an NMOS transistor M15, connected as shown in FIG. 8. During a write operation, a control signal SW is activated in synchronization with a clock signal. A control signal EOB (end of burst) is a signal indicating the completion of a write operation corresponding to a burst length. An active command signal PWR is activated when a write enable signal WEB is activated, and is deactivated when the control signal EOB is activated.

Figure 9:
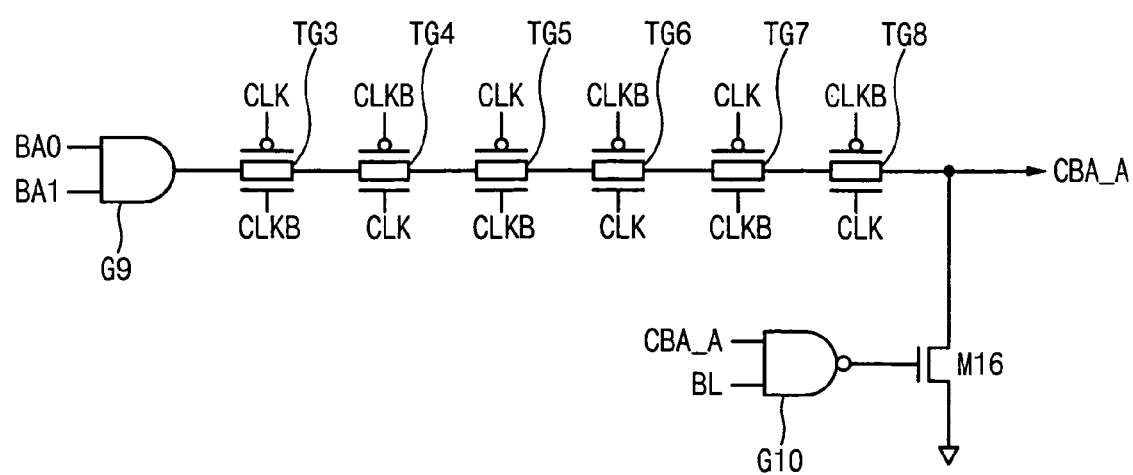
FIG. 9 is a schematic diagram of write command signal generation circuits according to some embodiments of the present invention.

Referring now to FIG. 9, write command signal generation circuits 220 according to embodiments of the present invention will be discussed. As illustrated in FIG. 9, the write command signal generation circuit 220 includes an AND gate G9, a NAND gate G10, an NMOS transistor M16, and third through eighth transmission gates TG3 through TG8, connected as illustrated in FIG. 9. A write command signal CBA_A is activated in synchronization with a clock signal when first and second bank address signals BA0 and BA1 transition to a high level, and is deactivated when a write operation corresponding to a burst length of its memory bank is completed or a control signal BL is deactivated.

Figure 10:
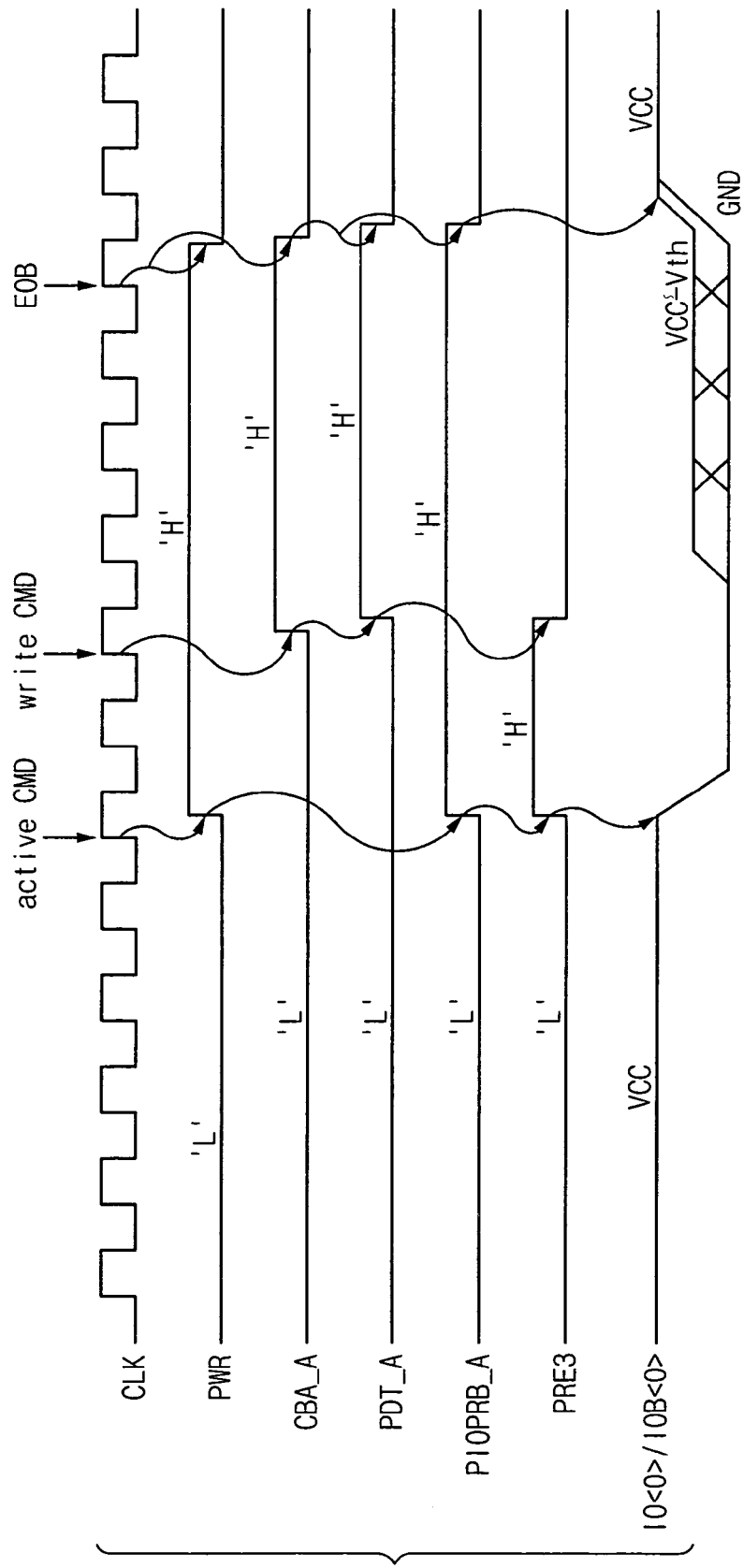
FIG. 10 is a timing diagram illustrating write operations of integrated circuit memory devices according to some embodiments of the present invention.

Operations of integrated circuit memory devices according to embodiments of the present invention will now be discussed with respect to the timing diagrams illustrated in FIGS. 10 and 11. FIG. 10 illustrates write operations of integrated circuit devices according to some embodiments of the present invention. Before an active command is input into the integrated circuit device, an active command signal PWR, a write command signal CBA_A, and a write pulse signal PDT_A are deactivated low and a master precharge signal PIOPRB_A is activated low. As the master precharge signal PIOPRB_A is activated low, the first signal generation circuit GEN3 190 activates an equalization signal EQ and a first precharge signal PRE1 to a low level. The first precharge circuit 130 precharges the pair of differential I/O lines IO<0> and IOB<0> to a power supply voltage VCC in response to the activation of a first precharge signal PRE1. The equalizer circuit 160 equalizes precharged voltages of the pair of differential I/O lines IO<0> and IOB<0> in response to the activation of the first precharge signal PRE1. Pull-up NMOS transistors (not shown) of the driver circuit 120 are turned off when the write pulse signal PDT_A is inactive.

When an active command is input, the active command signal PWR transitions from a low level to a high level in synchronization with a clock signal CLK. The signal generation circuit 180 deactivates the master precharge signal PIOPRB_A to a high level in response to the activation of the active command signal PWR. When the master precharge signal PIOPRB_A is deactivated, the first signal generation circuit GEN3 190 deactivates the precharge signal PRE1 and the equalization signal EQ and the second signal generation circuit GEN4 200 activates a precharge signal PRE3 to a high level. The third precharge circuit 150 precharges the pair of differential I/O lines IO<0> and IOB<0> to a voltage lower than a power supply voltage VCC, for example, a ground voltage, in response to the activation of the precharge signal PRE3.

When a write command is input into the integrated circuit device, the write command signal CBA_A transitions from a low level to a high level. The write pulse generation circuit 170 activates the write pulse signal PDT_A when the write command signal CBA_A is activated after activation of the active command signal PWR. The second signal generation circuit GEN4 200 deactivates a precharge signal PRE3 when the write pulse signal PDT_A is activated. As the write pulse signal PDT_A is activated, the I/O line driver circuit 120 transmits write data DIN<0> to the pair of differential I/O lines IO<0> and IOB<0>. In some embodiments of the present invention, the I/O lines IO<0> and IOB<0> are selectively driven with a voltage lower then VCC, for example, VCC–$V_{th}$. Operations of the integrated circuit device involving transmitting received data into the memory bank are known to those having skill in the art and will not be discussed further herein.

When the entire burst of data has been transmitted, the active command signal PWR and the write command signal CBA_A transition from a high level to a low level. As the write command signal CBA_A is deactivated, the write pulse signal PDT_A is deactivated while the master precharge signal PIOPRB_A is activated. Thus, the pair of differential I/O lines IO<0> and IOB<0> are precharged again to the power supply voltage VCC through the precharge circuit 130.

As further illustrated in FIG. 10, after the active command signal PWR is activated, the pair of differential I/O lines are precharged to a voltage lower than the power supply voltage VCC, for example, a ground voltage. This may lead to a reduction in a skew between the pair of differential I/O lines when write data is loaded on the pair of differential I/O lines.

Figure 11:
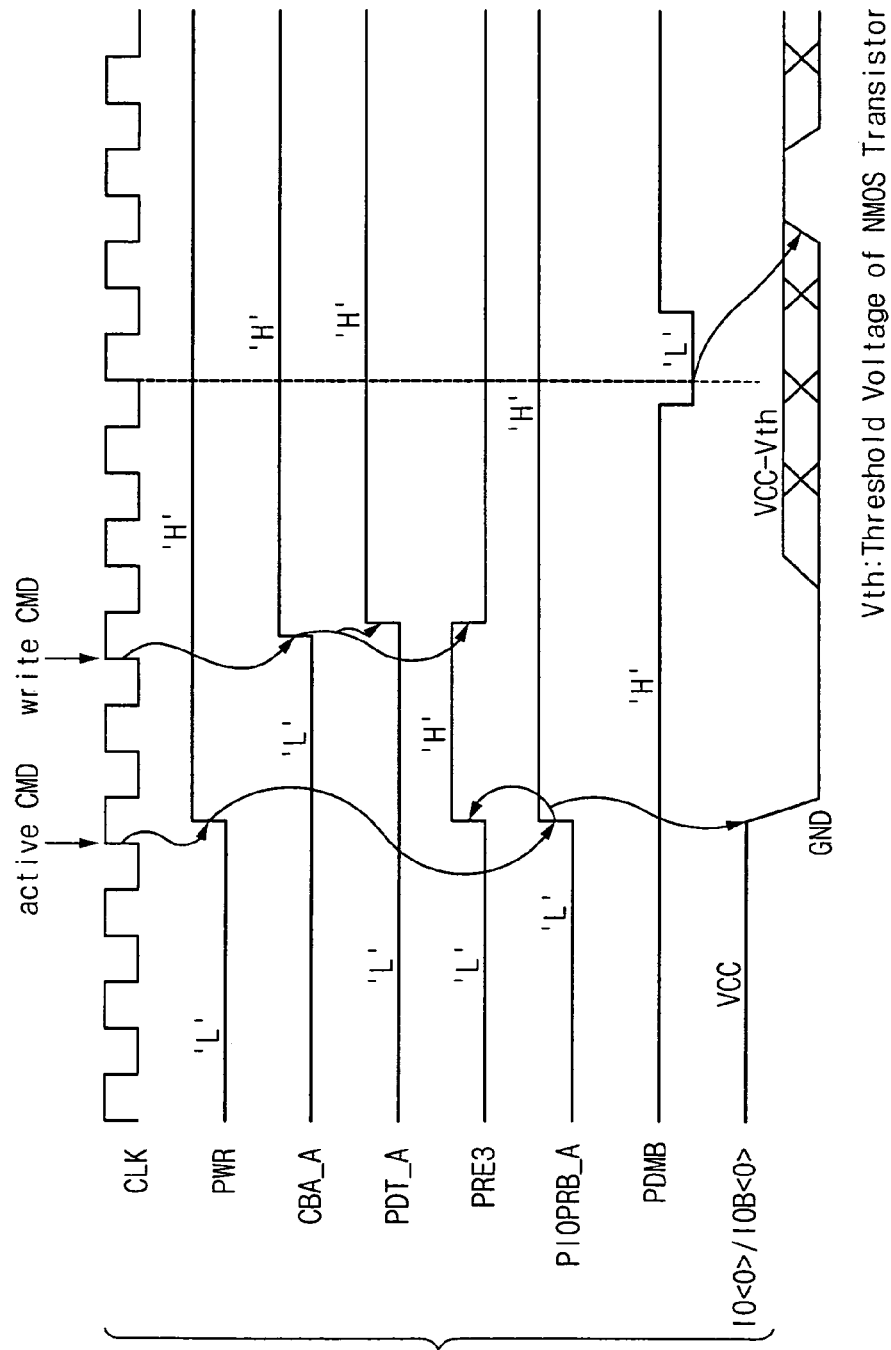
FIG. 11 is a timing diagram illustrating write operations paused by data masking in integrated circuit memory devices according to further embodiments of the present invention.

Referring now to FIG. 11, timing diagrams illustrating further operations of integrated circuit devices according to embodiments of the present invention will be discussed. In particular, write operations of integrated circuit devices according to embodiments of the present invention being interrupted by data masking will be discussed.

Before an active command is input into the integrated circuit device, an active command signal PWR, a write command signal CBA_A, and a write pulse signal PDT_A are deactivated low, and a master precharge signal PIOPRB_A is activated low. As the master precharge signal PIOPRB_A is activated low, the first signal generation circuit GEN3 190 activates an equalization signal EQ and the first precharge signal PRE1 to a low level. The first precharge circuit 130 precharges the pair of differential I/O, lines IO<0> and IOB<0> to a power supply voltage VCC in response to the activation of the first precharge signal PRE1. The equalizer circuit 160 equalizes voltages of the pair of differential I/O lines IO<0> and IOB<0> in response to the activation of the equalization signal EQ. Pull-up NMOS transistors (not shown) of the driver circuit 120 are turned off when the write pulse signal PDT_A is inactive.

When the active command is input, an active command signal PWR transitions from a low level to a high level in synchronization with a clock signal CLK. The signal generation circuit 180 deactivates the master precharge signal PIOPRB_A to a high level responsive to the activation of the active command signal PWR. When the master precharge signal PIOPRB_A is deactivated, the first signal generation circuit GEN3 190 deactivates the precharge signal PRE1 and the equalization signal EQ; and the second signal generation circuit GEN4 200 activates the precharge, signal PRE3 to a high level. The third precharge circuit 150 precharges the pair of differential I/O lines IO<0> and IOB<0> to a voltage lower than the power supply voltage VCC, for example, a ground voltage, in response to the activation of the precharge signal PRE3.

When a write command is input, the write command signal CBA_A transitions from a low level to a high level. The write pulse generation circuit 170 activates the write pulse signal PDT_A when the write command signal CBA_A is activated after activation of the active command signal PWR. The second signal generation circuit GEN4 200 deactivates the precharge signal PRE3 when the write pulse signal PDT_A is activated, which results in deactivation of the precharge circuit 150. As the write pulse signal PDT_A is activated, the I/O line driver circuit 120 transmits write data DIN<0> to the pair of differential I/O lines IO<0> and IOB<0>. In some embodiments of the present invention, the I/O lines are selectively driven with a voltage lower than the power supply voltage VCC, for example, VCC–$V_{th}$. Operations of the integrated circuit device involving transmitting received data into the memory bank 100 are known to those having skill in the art and will not be discussed further herein.

In some embodiments of the present invention, a data masking signal PDMB may be activated during the write operation, in these embodiments the integrated circuit memory device may not receive corresponding data. In other words, the pair of differential I/O lines IO<0> and IOB<0> may be precharged to a voltage lower than the power supply voltage VCC. More specifically, when the data masking signal PDMB transitions from a high level to a low level, the I/O line driver circuit 120 is deactivated while the first signal generation circuit GEN3 190 activates a precharge signal PRE2 to a high level and activates the equalization signal EQ to a low level. This enables the precharge circuit 140 to precharge the pair of differential I/O lines IO<0> and IOB<0> to $VCC-V_{th}$. As the data masking signal PDMB is deactivated, the precharge circuit 140 and the equalization circuit 160 are deactivated and the I/O line driver circuit 120 is activated.

As further illustrated in FIG. 11, when the data masking signal PDMB is activated, the pair of differential I/O lines IO<0> and IOB<0> are precharged to a voltage lower than the power supply voltage VCC, for example, $VCC-V_{th}$. Accordingly, it may be possible to reduce a skew between the pair of differential I/O lines (or I/O line pairs) when data is reloaded on the I/O lines.

Figure 12:
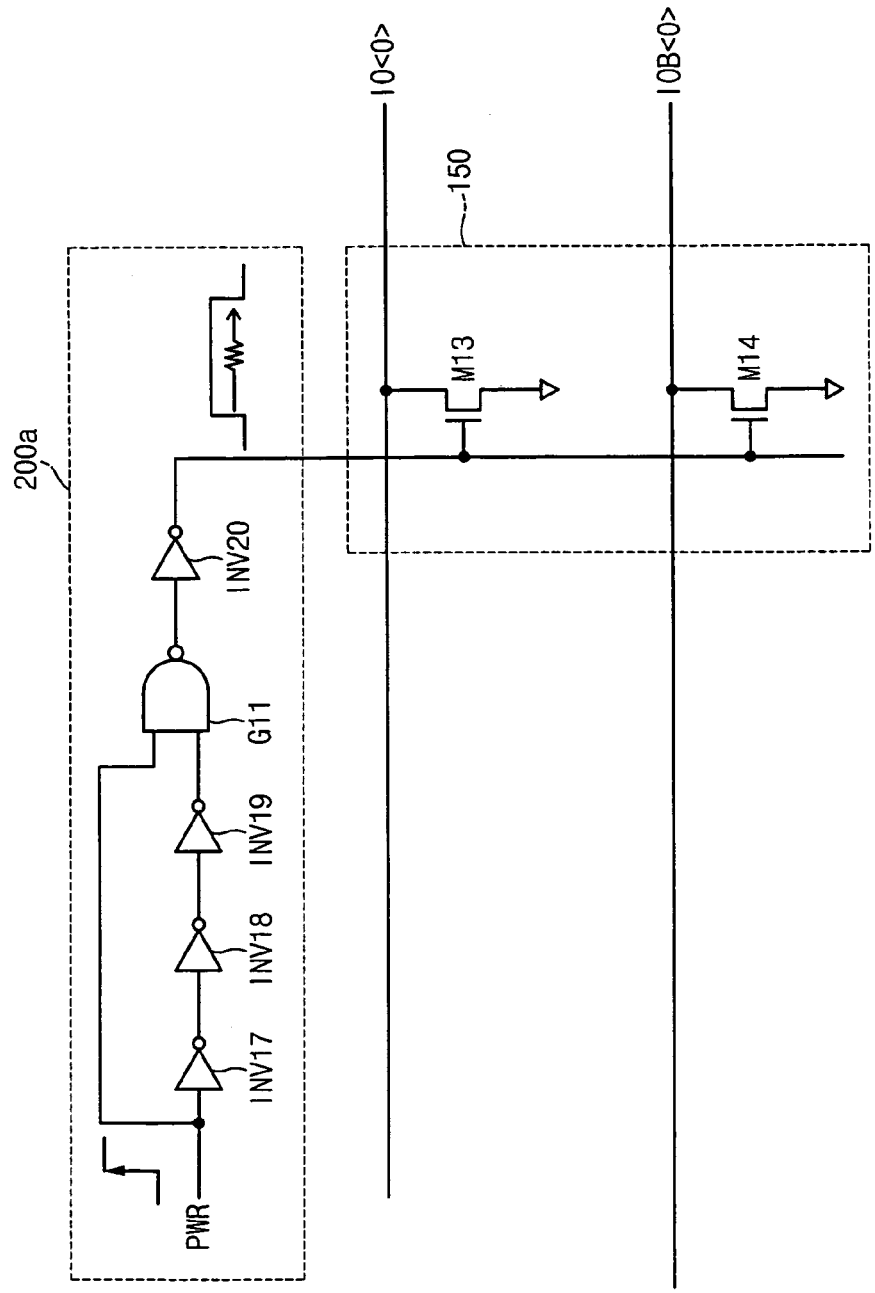
FIG. 12 is a schematic diagram of signal generation circuits according to further embodiments of the present invention.

Referring now to FIG. 12, signal generation circuits 200a according to further embodiments of the present invention will be discussed. As illustrated in FIG. 12, a second signal generation circuit GEN4 200a includes a pulse generator having first, second and third inverters INV17, INV18, and INV19 and a NAND gate G11 and a fourth inverter INV20, connected as illustrated in FIG. 12. The second signal generation circuit GEN4 200a generates a third precharge signal PRE3 having a predetermined pulse width when an active command signal PWR transitions from a low level to a high level, i.e., the active command signal PWR is activated. The pulse width of the third precharge signal PRE3 is determined such that the third precharge signal PRE3 is deactivated before or simultaneously with activation of a write command signal CBA_A.

Figure 13:
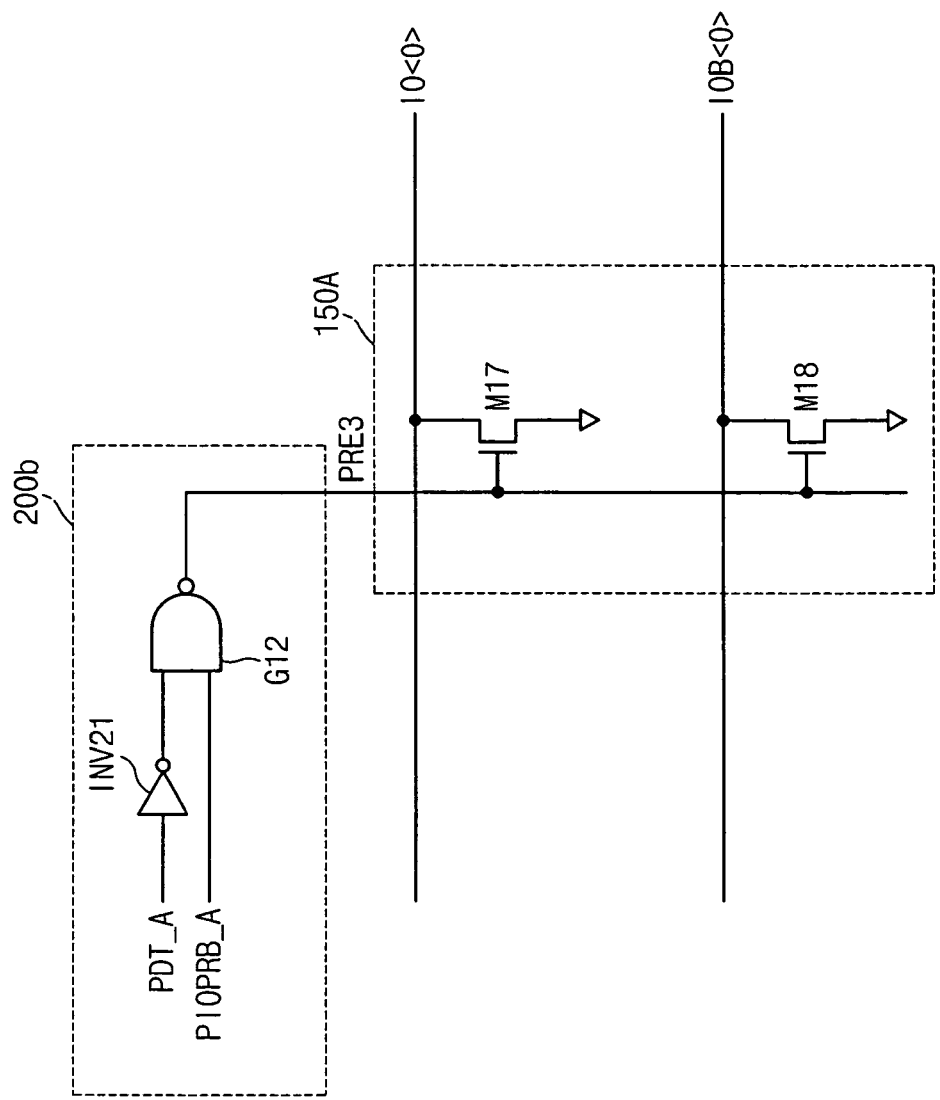
FIG. 13 is a schematic diagram of signal generation circuits and precharge circuits according to some embodiments of the present invention.

Referring now to FIG. 13, a schematic diagram of signal generation circuits and third precharge circuits according further embodiments of the present invention will be discussed. As illustrated in FIG. 13, a third precharge circuit 150A includes first and second PMOS transistors M17 and M18. The first PMOS transistor M17 is coupled between an I/O line IO<0> and a ground voltage and is controlled by a precharge signal PRE3 from a second signal generation circuit GEN4 200b. The second PMOS transistor M18 is coupled between an I/O line IOB<0> and a ground voltage and is controlled by the precharge signal PRE3 from the second signal generation circuit GEN4 200b. The precharge signal PRE3 is activated low when a master precharge signal PIOPRB_A is deactivated low, and is deactivated when a write pulse signal PDT_A is activated high. Accordingly, in embodiments of the present invention illustrated in FIG. 13, the pair of differential I/O lines IO<0> and IOB<0> may be precharged to a voltage lower than a power supply voltage VCC, for example, $VCC-V_{th}$.

Figure 14:
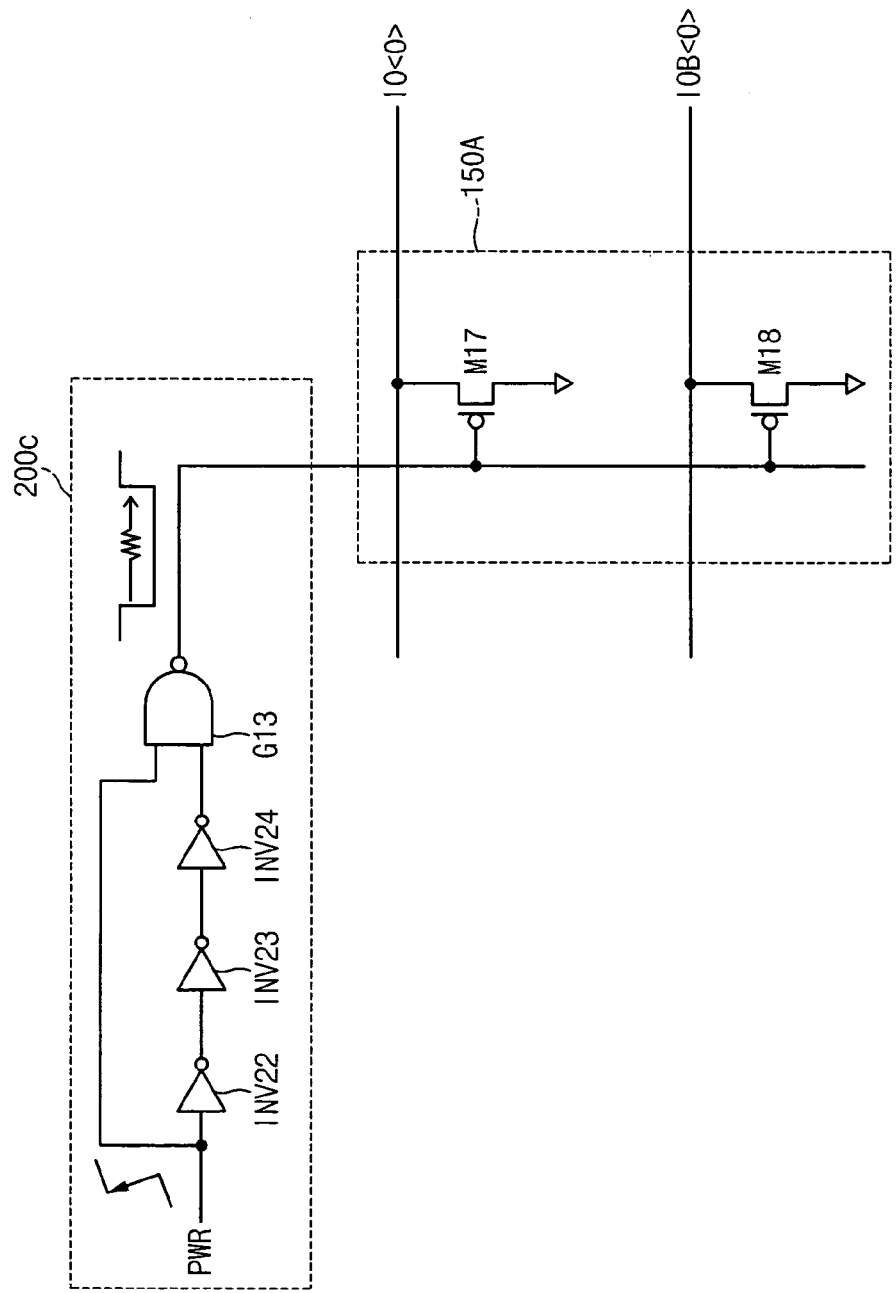
FIG. 14 is a schematic diagram of signal generation circuits according to further embodiments of the present invention.

Referring now to FIG. 14, signal generation circuits and third precharge circuits according to still further embodiments of the present invention will be discussed. A second signal generation circuit GEN4 200c includes a pulse generator having first, second and third inverters INV22, INV23, and INV24 and a NAND gate G13, connected as illustrated in FIG. 14. The second signal generation circuit GEN4 200c generates a precharge signal PRE3 having a predetermined pulse width when an active command signal PWR transitions from a low level to a high level, i.e., when the active command signal PWR is activated. The pulse width of the precharge signal PRE3 is determined such that the precharge signal PRE3 is deactivated before, or simultaneously with, activation of a write command signal CBA_A. A precharge signal 150A includes first and second PMOS transistors M17 and M18. The first PMOS transistor M17 is coupled between an I/O line IO<0> and a ground voltage and is controlled by the precharge signal PRE3 from the second signal generation circuit GEN4 200c. The second PMOS transistor M18 is coupled between the I/O line IOB<0> and a ground voltage and is controlled by the precharge signal PRE3 from the second signal generation circuit GEN4 200c. Accordingly, in embodiments of the present invention illustrated in FIG. 14, the pair of differential I/O lines IO<0> and IOB<0> may be precharged to a voltage lower than the power supply voltage VCC, for example, $VCC-V_{th}$.

Figure 15:
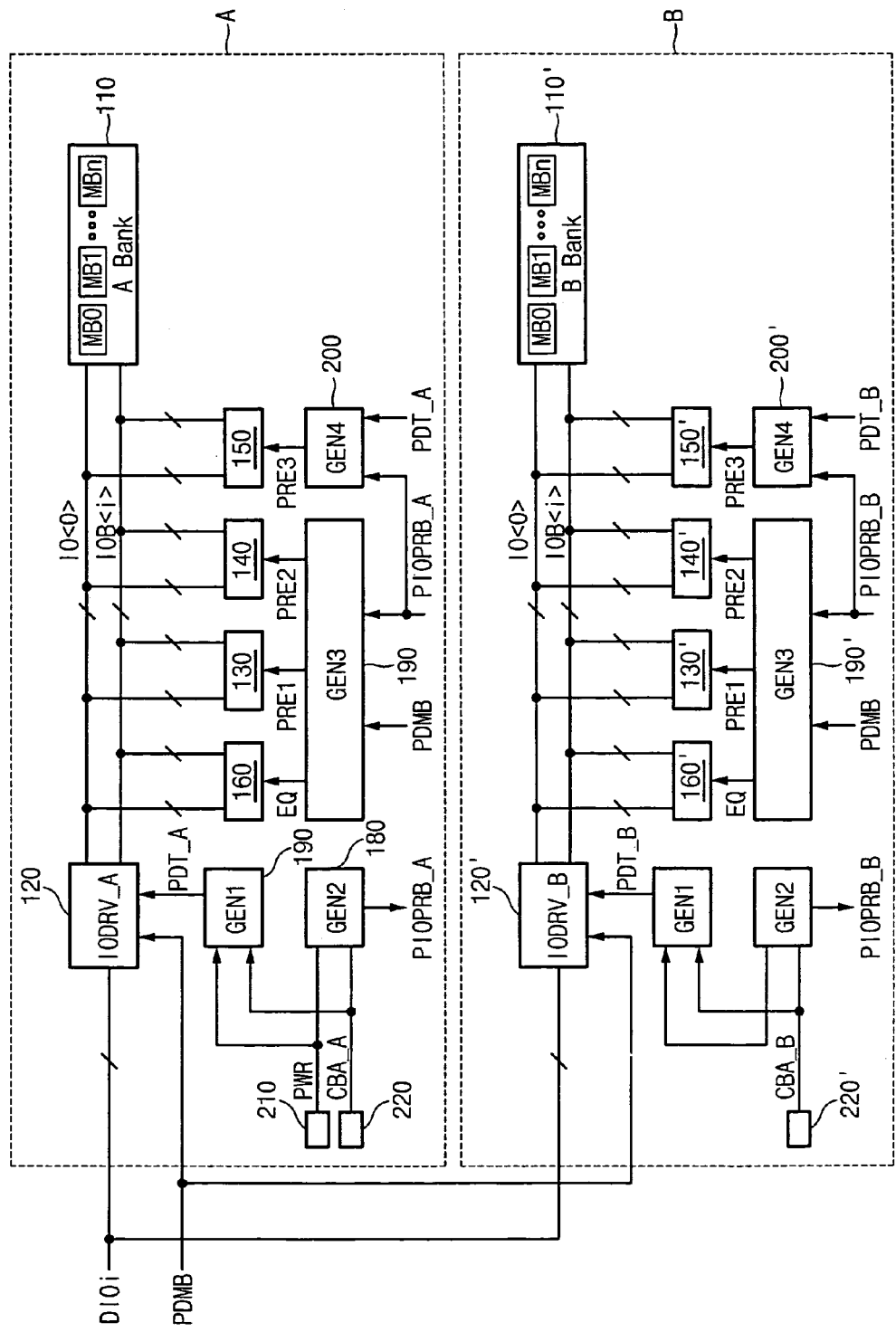
FIG. 15 is a block diagram of integrated circuit memory devices according to some embodiments of the present invention.
Figure 16:
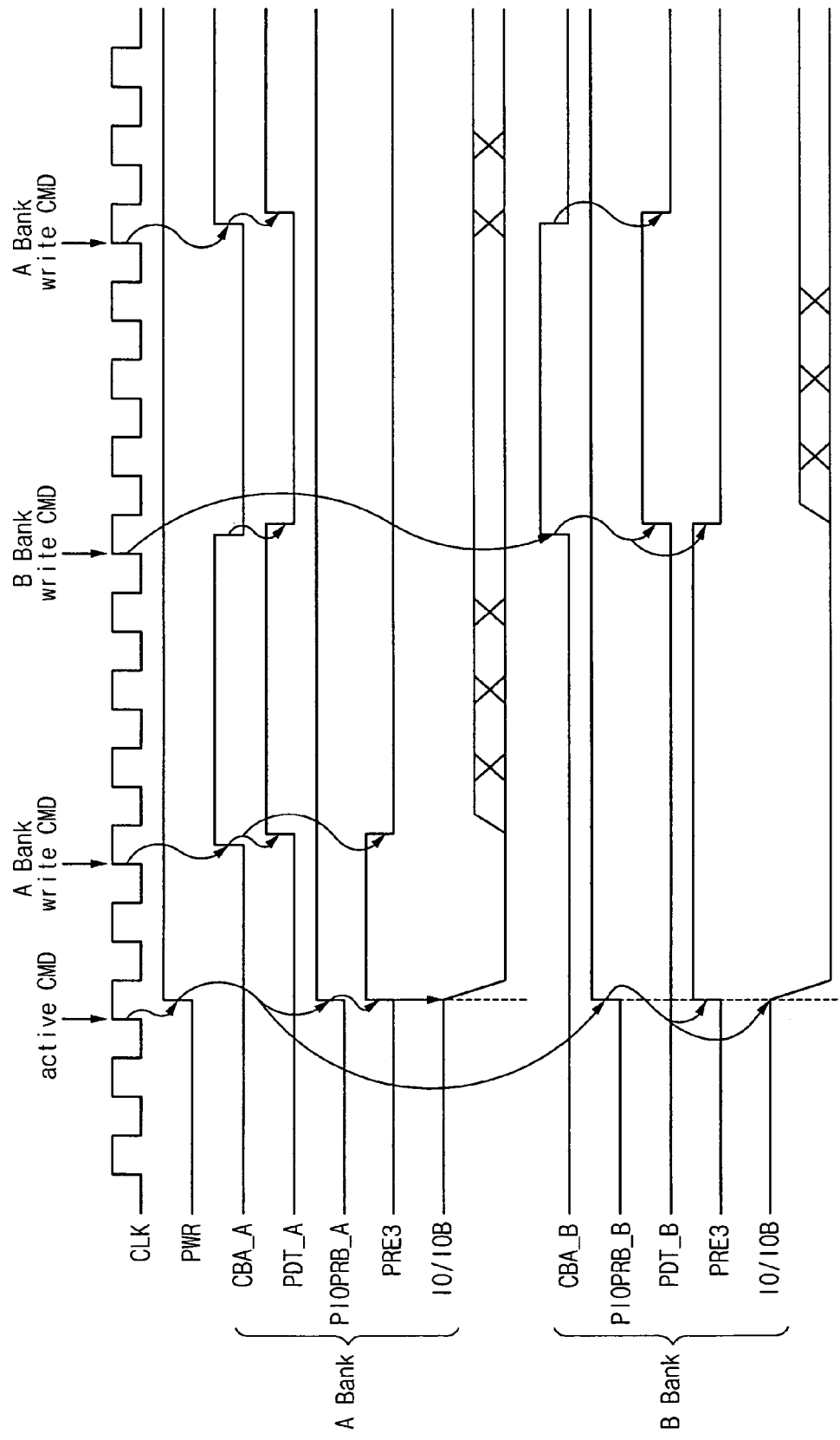
FIG. 16 is a timing diagram illustrating write operations of integrated circuit memory devices according to embodiments of the present invention illustrated in FIG. 15.

Referring now to FIGS. 15 and 16, integrated circuit memory devices according to embodiments of the present invention and operations thereof will be discussed. The integrated circuit memory device includes first and second memory blocks A and B. The first, memory block A includes a first memory bank 110 and associated circuits and the second memory block includes a second memory bank 110' and associated circuits. Elements depicted in the first and second memory blocks A and B of FIG. 15 are similar to like numbered elements illustrated in FIG. 5, thus, in the interest of brevity the functionality of these elements will not be repeated herein. FIG. 16 is a timing diagram illustrating operations of integrated circuit memory devices according to embodiments of the present invention.

A seamless write operation of the integrated circuit memory device will now be described with reference to FIGS. 15 and 16. Before an active command is input into the integrated circuit device, an active command signal PWR, write command signals CBA_A and CBA_B, and write pulse signal PDT_A and PDT_B are deactivated low and master precharge signals PIOPRB_A and PIOPRB_B are activated low. As the master precharge signals PIOPRB_A and PIOPRB_B are activated low, signal generation circuits 190 and 190' activate an equalization signal EQ and a first precharge signal PRE1 to a low level, respectively. With respect to the first memory block A, a first precharge circuit 130 precharges a pair of differential I/O lines IO<0> and IOB<0> to a power supply voltage VCC in response to the activation of the first precharge signal PRE1. An equalizer circuit 160 equalizes the precharged voltages of the pair of differential I/O lines IO<0> and IOB<0> responsive to the activation of the equalization signal EQ.

With respect to the second memory block B, a first precharge circuit 130' precharges a pair of differential I/O lines IO<0> and IOB<0> to a power supply voltage in response to the activation of the first precharge signal PRE3. An equalizer circuit 160' equalizes precharged voltages of the pair of differential I/O lines IO<0> and IOB<0> of the second memory bank 110' in response to the activation of the equalization signal EQ.

Referring again to the first memory block A, as an active command is input, an active command signal PWR transitions from a low level to a high level in synchronization with a clock signal CLK. A signal generation circuit 180 deactivates a master precharge signal PIOPRB_A to a high level in response to the activation of the active command signal PWR. When the master precharge PIOPRB_A is deactivated, a first signal generation circuit GEN3 190 deactivates the precharge signal PRE1 and the equalization signal EQ and a second signal generation circuit GEN4 200 activates the precharge signal PRE3 to a high level. The third precharge circuit 150 precharges the pair of differential I/O lines IO<0> and IOB<0> to a voltage lower than a power supply voltage VCC, for example, a ground voltage, in response to the activation of the precharge signal PRE3.

Similarly, with respect to the second memory block B, a signal generation circuit 180' deactivates a master precharge signal PIOPRB_B to a high level in response to the activation of the active command signal PWR. When the master precharge signal PIOPRB_B is deactivated, a first signal generation circuit GEN3 190' deactivates the precharge signal PRE1 and the equalization signal EQ and a second signal generation circuit GEN4 200' activates the precharge signal PRE3 to a high level. A third precharge circuit 150' precharges the pair of differential I/O lines IO<0> and IOB<0> to a voltage lower than a power supply voltage VCC, for example, a ground voltage, in response to the activation of the precharge signal PRE3.

When a write command associated with the memory bank is input, the write command signal CBA_A transitions from a low level to a high level. A write pulse generation circuit 170 activates a write pulse signal PDT_A when the write command signal CBA_A is activated after the activation of the active command signal PWR. A second signal generation circuit GEN4 200 deactivates a precharge signal PRE3 when the write pulse signal PDT_A is activated, which results in deactivation of the precharge circuit 150. As the write pulse signal PDT_A is activated, the I/O line driver circuit 120 transmits write data DIN<0> to the pair of differential I/O lines IO<0> and IOB<0>. In some embodiments of the present invention, the pair of differential I/O lines are selectively driven with a voltage lower than a power supply voltage VCC, for example, VCC-$V_{th}$. Operations of the integrated circuit device involving transmitting received data into the memory bank are known to those having skill in the art and will not be discussed further herein.

During the write operation for the first memory bank 110, the pair of differential I/O lines IO<i> and IOB<i> of the second memory bank 110' are continuously precharged using the precharge circuit 150'. When a full burst of data is transmitted to the first memory bank 110 and a write command for a write operation of the second memory bank 110' is input, the write command signal CBA_B of the second memory bank 110' transitions from a low level to a high level. In this case, because the active command signal PWR is maintained at a high level, the master precharge signal PIOPRB_A is continuously deactivated high irrespective of the deactivation of the write command signal CBA_A. In other words, the pair of differential I/O lines IO<i> and IOB<i> are maintained at a ground voltage and a voltage of VCC-$V_{th}$ or visa versa according to a value of data finally loaded without precharge.

As the write command signal CBA_B associated with the second memory bank 110' is activated high, a write pulse generation circuit 170' activates a write pulse signal PDT_B. A second signal generation circuit GEN4 200' deactivates the precharge signal PRE3 when the write pulse signal PDT_B is activated, which results in deactivation of the precharge circuit 150'. As the write pulse signal PDT_B is activated, the I/O line driver circuit 120' transmits the write data DIN<0> to the pair of differential I/O lines IO<0> and IOB<0>. In this case, the pair of differential I/O lines may be selectively driven with a voltage of VCC-$V_{th}$. Operations of the integrated circuit device involving transmitting received data into the memory bank are known to those having skill in the art and will not be discussed further herein. The subsequent write operation is similar to operations discussed above and will not be described further herein.

As briefly discussed above, during a seamless write operation, the pair of differential I/O lines of memory banks 110 and 110' are simultaneously precharged to a voltage lower than a power supply voltage VCC. Accordingly, a skew between the I/O lines (or I/O line pairs) may be reduced. In particular, when the write operation of the first memory bank 110 is completed and the write operation of the second memory bank 110' is conducted, the pair of differential I/O lines of the first memory bank 110 may not be precharged. In other words, the pair of differential I/O lines of the first memory bank 110 may be maintained at a ground voltage or a voltage of VCC-$V_{th}$ depending upon a value of finally loaded data. Similarly, when the write operation of the second memory bank 110' is completed and the write operation of the memory bank 110 is re-conducted, the I/O lines of the second memory bank 110' are not precharged. In other words, the pair of differential I/O lines of the second memory bank 110' may be maintained at a ground voltage or a voltage of VCC-$V_{th}$ depending upon the value of the finally loaded data. Accordingly, it may be possible to reduce the amount of power consumption when I/O lines of one memory bank are precharged while data is written in another memory bank according to embodiments of the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device comprising:
   a pair of differential I/O lines;
   a driver circuit configured to operate responsive to a write command signal and drive the pair of differential I/O lines;
   a first precharge circuit configured to precharge the pair of differential I/O lines to a first voltage during a first mode of operation responsive to an active command signal; and
   a second precharge circuit configured to precharge the pair of differential I/O lines to a second voltage, lower than the first voltage, during a second mode of operation responsive to the active command signal.

2. The integrated circuit device of claim 1, further comprising a timing control circuit configured to deactivate the first precharge circuit and activate the second precharge circuit responsive to assertion of the active command signal.

3. The integrated circuit device of claim 2, wherein the timing circuit is further configured to deactivate the second precharge circuit responsive to assertion of the write command signal.

4. The integrated circuit device of claim 2, wherein the timing control circuit is further configured to activate the first precharge circuit responsive to the deactivation of the active command signal.

5. The integrated circuit device of claim 3; wherein the first voltage is a power supply voltage, wherein the second voltage is a ground voltage, wherein the second precharge circuit comprises first and second NMOS transistors, wherein the first NMOS transistor is coupled between a first of the pair of differential I/O lines and the ground voltage and wherein the second NMOS transistor is coupled between a second of the pair of differential I/O lines and the ground voltage.

6. The integrated circuit of claim 1, wherein the second voltage is equal to a power supply voltage (VCC) decreased by a threshold voltage of a PMOS transistor ($V_{th}$).

7. The integrated circuit device of claim 1, wherein the integrated circuit device comprises an integrated circuit memory device.

8. An integrated circuit device comprising:
a pair of differential I/O lines;
a driver circuit configured to operate responsive to a write command signal and to drive the pair of differential I/O lines;
a first precharge circuit configured to precharge the pair of differential I/O lines to a first voltage during a first mode of operation responsive to an active command signal;
a second precharge circuit configured to precharge the pair of differential I/O lines to a second voltage, lower than the first voltage, during a second mode of operation responsive to the active command signal; and
a third precharge circuit configured to precharge the pair of differential I/O lines to a third voltage during a third mode of operation responsive to a data masking signal.

9. The integrated circuit device of claim 8 further comprising:
a timing control circuit configured to deactivate the first precharge circuit and activate the second precharge circuit responsive to assertion of the active command signal and to activate the third precharge circuit responsive to the data masking signal.

10. The integrated circuit device of claim 9, wherein the integrated circuit device comprises an integrated circuit memory device.

11. The integrated circuit device of claim 8, wherein the timing control circuit is further configured to deactivate the second precharge circuit responsive to assertion of the write command signal.

12. The integrated circuit device of claim 8, wherein the first voltage is a power supply voltage (VCC), wherein the second voltage is at least one of a ground voltage or the power supply voltage (VCC) decreased by a threshold voltage of a PMOS transistor ($V_{th}$) and wherein the third voltage is the power supply voltage decreased by the threshold voltage of an NMOS transistor ($V_{th}$).

13. The integrated circuit device of claim 8, wherein the third precharge circuit comprises first and second NMOS transistors, wherein the first NMOS transistor is coupled between a first of the pair of differential I/O lines and the power supply voltage and wherein the second NMOS transistor is coupled between a second of the pair of differential I/O lines and the ground voltage.

14. The integrated circuit device of claim 8, further comprising an equalizer circuit coupled between the pair of differential I/O lines, wherein the timing control circuit is further configured to activate the equalizer circuit when at least one of the active command signal and the data masking signal is asserted.

15. The integrated circuit device of claim 8, wherein the timing control circuit is further configured to activate the third precharge circuit responsive to activation of the data masking signal and deactivate the third precharge circuit responsive to deactivation of the data masking signal.

16. An integrated circuit memory device comprising:
first and second memory banks comprising a first plurality of memory blocks and a second plurality of memory blocks, respectively;
a first pair of differential I/O lines coupled to the first memory bank;
a second pair of differential I/O lines coupled to the second memory bank;
a first precharge circuit associated with the first memory bank;
a second precharge circuit associated with the second memory bank, the first and second precharge circuits being configured to precharge the first pair of differential I/O lines and the second pair of differential I/O lines to a first voltage, respectively;
a third precharge circuit associated with the first memory bank;
a fourth precharge circuit associated with the second memory bank, the third and fourth precharge circuits being configured to precharge the first pair of differential I/O lines and the second pair of differential I/O lines to a second voltage, lower than the first voltage, respectively; and
a timing control circuit configured to deactivate the first and second precharge circuits and activate the third and fourth precharge circuits responsive to assertion of an active command signal.

17. The integrated circuit memory device of claim 16, wherein the timing control circuit is further configured to deactivate the third or fourth precharge circuit responsive to assertion of a first or a second write command signal, respectively, and to maintain the third or fourth precharge circuit corresponding to a non-asserted first or second write command signal at an active state.

18. The integrated circuit memory device of claim 16, wherein the timing control circuit is further configured to activate the first and second precharge circuits when the active command signal is deactivated.

19. The integrated circuit memory device of claim 16, wherein the third precharge circuit of the first memory bank is deactivated and the fourth precharge circuit of the second memory bank is maintained at an active state when a first write command signal is asserted.

20. The integrated circuit memory device of claim 19, wherein the third precharge circuit of the first memory bank is maintained at an inactive state and the fourth precharge circuit of the second memory bank is deactivated when the first write command signal is deactivated and a second write command signal is activated.

21. The integrated circuit memory device of claim 16, further comprising a fifth precharge circuit associated with the first memory bank and a sixth precharge circuit associated with the second memory bank, the fifth and sixth precharge circuits being configured to precharge the first pair of differential I/O lines and the second pair of differential I/O lines, respectively, to a third voltage lower than the first voltage.

22. The integrated circuit memory device of claim 21, wherein the timing control circuit is further configured to activate the fifth and sixth precharge circuits responsive to a data masking signal.

23. A method of operating an integrated circuit device comprising:
driving a pair of differential I/O lines responsive to a write command signal;

precharging the pair of differential I/O lines to a first voltage during a first mode of operation responsive to an active command signal; and precharging the pair of differential I/O lines to a second voltage, lower than the first voltage, during a second mode of operation responsive to assertion of the active command signal.

24. The method of claim 23, further comprising deactivating the first precharge circuit and activating the second precharge circuit responsive to the active command signal.

25. The method of claim 23, further comprising deactivating the second precharge circuit responsive to the write command signal.

26. The method of claim 23, further comprising, activating the first precharge circuit responsive to the deactivation of the active command signal.

27. A method of operating an integrated circuit device comprising:

driving a pair of differential I/O lines responsive to a write command signal;

precharging the pair of differential I/O lines to a first voltage during a first mode of operation responsive to an active command signal;

precharging the pair of differential I/O lines to a second voltage, lower than the first voltage, during a second mode of operation responsive to the active command signal; and precharging the pair of differential I/O lines to a third voltage during a third mode of operation responsive to a data masking signal.

28. The method of claim 27, further comprising:

deactivating the first precharge circuit and activating the second precharge circuit responsive to assertion of the active command signal; and activating the third precharge circuit responsive to a data masking signal.

29. The method of claim 27, further comprising:

activating the third precharge circuit responsive to activation of the data masking signal; and deactivating the third precharge circuit responsive to deactivation of the data masking signal.

30. The method of claim 27, further comprising deactivating the second precharge circuit responsive to assertion of the write command signal.

31. The method of claim 27, further comprising activating an equalizer circuit when at least one of the active command signal and the data masking signal is asserted.

32. A method of operating an integrated circuit device including a memory bank having a plurality of memory blocks and pairs of differential I/O lines coupled to the plurality of memory banks, the method comprising:

precharging the pairs of differential I/O lines to a first voltage responsive to activation of an active command signal;

pausing the precharging operation of the pair of differential I/O lines responsive to the activation of a write command signal;

driving the pair of differential I/O lines according to external data; and precharging the pair of differential I/O lines to a second voltage, lower than the first voltage, responsive to assertion of the active command signal.

33. The method of claim 32, wherein the first voltage is a power supply voltage (VCC) decreased by a threshold voltage of a PMOS transistor or an NMOS transistor ($V_{th}$).

34. The method of claim 32, further comprising:

precharging the pair of differential I/O lines to a third voltage lower, than the second voltage, responsive activation of a data masking signal.

* * * * *